(12) United States Patent
Lo et al.

(10) Patent No.: US 12,660,104 B2
(45) Date of Patent: Jun. 16, 2026

(54) DETACHABLE CABLE HUB DEVICE AND HOST CASING HAVING DETACHABLE CABLE HUB DEVICE

(71) Applicant: AETINA CORPORATION, New Taipei City (TW)

(72) Inventors: Chih-Jung Lo, New Taipei City (TW); Ying-Jui Hung, New Taipei City (TW); Yung-Ho Lee, New Taipei City (TW)

(73) Assignee: AETINA CORPORATION, New Taipei City (TW)

( * ) Notice: Subject to any disclaimer, the term of this patent is extended or adjusted under 35 U.S.C. 154(b) by 327 days.

(21) Appl. No.: 18/522,277

(22) Filed: Nov. 29, 2023

(65) Prior Publication Data

US 2024/0305036 A1     Sep. 12, 2024

Related U.S. Application Data

(60) Provisional application No. 63/451,240, filed on Mar. 10, 2023.

(51) Int. Cl.
| | |
|---|---|
| *H05K 5/00* | (2025.01) |
| *G06F 1/18* | (2006.01) |
| *H01R 13/518* | (2006.01) |
| *H01R 25/00* | (2006.01) |
| *H05K 5/02* | (2006.01) |
| *H05K 5/03* | (2006.01) |
| *H05K 5/10* | (2025.01) |

(52) U.S. Cl.
CPC ........... *H05K 5/0217* (2013.01); *G06F 1/181* (2013.01); *H01R 13/518* (2013.01); *H01R 25/006* (2013.01); *H05K 5/0221* (2013.01);

*H05K 5/0226* (2013.01); *H05K 5/03* (2013.01); *H05K 5/10* (2025.01)

(58) Field of Classification Search
None
See application file for complete search history.

(56) References Cited

U.S. PATENT DOCUMENTS

| | | | | |
|---|---|---|---|---|
| 5,640,482 | A | * | 6/1997 | Barry ................. G02B 6/44528 |
| | | | | 385/136 |
| 9,578,761 | B2 | * | 2/2017 | Chitaka .................... H05K 5/00 |
| 10,490,228 | B2 | * | 11/2019 | Wang ..................... G11B 33/02 |

FOREIGN PATENT DOCUMENTS

| | | |
|---|---|---|
| CN | 208924402 U | 5/2019 |
| TW | M541691 U | 5/2017 |

* cited by examiner

*Primary Examiner* — Imani N Hayman
*Assistant Examiner* — Rashen E Morrison

(57) ABSTRACT

A detachable cable hub device includes a covering, a first connection module, and a second connection module. The first connection module includes a first sidewall and a first connection seat, and one end of the first sidewall is connected to a first side of the covering. The second connection module includes a second sidewall and a second connection seat, and one end of the second sidewall is connected to a second side of the covering, wherein the first and second sides are opposite. The first sidewall is provided with a first installation portion, and the second sidewall is provided with a second installation portion. A distance of the first installation portion to the covering is different from a distance of the second installation portion thereto. The first connection seat is disposed at the first installation portion, and the second connection seat is disposed at the second installation portion.

1 Claim, 3 Drawing Sheets

100

DETACHABLE CABLE HUB DEVICE AND HOST CASING HAVING DETACHABLE CABLE HUB DEVICE

CROSS-REFERENCE TO RELATED APPLICATION

This non-provisional application claims priority under 35 U.S.C. § 119(e) on U.S. provisional Patent Application No. 63/451,240 filed on Mar. 10, 2023, the entire contents of which are hereby incorporated by reference.

BACKGROUND OF THE INVENTION

1. Field of the Invention

The present disclosure relates to a cable hub device and a host casing, and in particular to a detachable cable hub device and a host casing having the detachable cable hub device.

2. Description of the Related Art

In a conventional computer device, various types of data are typically stored in a data storage device. Accompanied with increasing demand for increased data storage capacity, more data storage devices need to be installed in a computer casing. In general, when a data storage device is assembled, the data storage device needs to be mounted on a fixing frame of a casing, and signal cables are then individually connected to connectors of the data storage device and a connection seat on a motherboard.

As the number of data storage devices that need to be assembled increases, assembly staff need to connect the signal cables one after another to the connectors of the data storage device and the connection seat on the motherboard, resulting in a large amount of assembly time. In addition, spaces also need to be reserved between fixing frames for the signal cables, hence occupying an enormous space and disfavoring miniaturization of a computer casing.

BRIEF SUMMARY OF THE INVENTION

Therefore, to overcome various issues of conventional data storage devices, the present disclosure provides a detachable cable hub device and a host casing having the detachable cable hub device.

To achieve the above and other objects, the present disclosure provides a detachable cable hub device, including a covering, a first connection module, including a first sidewall and a first connection seat, wherein one end of the first sidewall is connected to a first side of the covering, and a second connection module, including a second sidewall and at least one second connection seat, wherein one end of the second sidewall is connected to a second side of the covering, and the first side and the second side are two opposite sides. The first sidewall is provided with at least one first installation portion, and the second sidewall is provided with at least one second installation portion. A distance of the first installation portion to the covering is different from a distance of the second installation portion to the covering. The at least one first connection seat is disposed at the at least one first installation portion, and the at least one second connection seat is disposed at the at least one second installation portion.

In an embodiment of the present disclosure, the covering, the first sidewall, and the second sidewall are formed from bending a single sheet of material.

In an embodiment of the present disclosure, the first connection module further includes a first fixing portion disposed on the first side.

In an embodiment of the present disclosure, the covering, the first sidewall, and the first fixing portion are formed from bending a single sheet of material.

In an embodiment of the present disclosure, the second connection module further includes a second fixing portion disposed on the second side.

In an embodiment of the present disclosure, the covering, the second sidewall, and the second fixing portion are formed from bending a single sheet of material.

In an embodiment of the present disclosure, the at least one first installation portion is plural in quantity, and the at least one second installation portion is plural in quantity.

The present disclosure further provides a host casing having the detachable cable hub device. The host casing includes a casing, having at least two fixing frames which are not on a same plane, and the detachable cable hub device as described above, disposed between the at least two fixing frames.

In an embodiment of the present disclosure, the casing includes a body and an upper cover. The upper cover is rotatably disposed at the body, and the at least two fixing frames are disposed on a surface of the upper cover facing the body.

Thus, the detachable cable hub device and the host casing having the detachable cable hub device allow signal cables to be gathered inside the detachable cable hub device, thereby preventing the cables from being exposed and protecting the cables, as well as enhancing aesthetics and values of products. In addition, since the first connection seat and the second connection seat installed on the first sidewall and the second sidewall are on different horizontal planes (that is, a staggered design), a distance between the first sidewall and the second sidewall is reduced to further reduce an overall configuration space of the casing, hence better meeting design requirements for miniaturization.

DETAILED DESCRIPTION OF THE INVENTION

To fully understand the present disclosure, the present disclosure is described in detail by way of specific embodiments with the accompanying drawings. A person skilled in the art would be able to understand the objects, features, and effects of the present disclosure on the basis of the disclosure of the present application. It should be noted that, the present disclosure may be implemented or applied by other specific embodiments, and changes and modifications may also be made on the basis of different perspectives and applications to various details in the description without departing from the spirit of the present disclosure. Technical contents associated with the present disclosure are described in detail below, and it should be noted that the disclosure is not to be construed as limitations to the scope of claims of the present disclosure. Associated details are as given in the description below.

Figure 3:
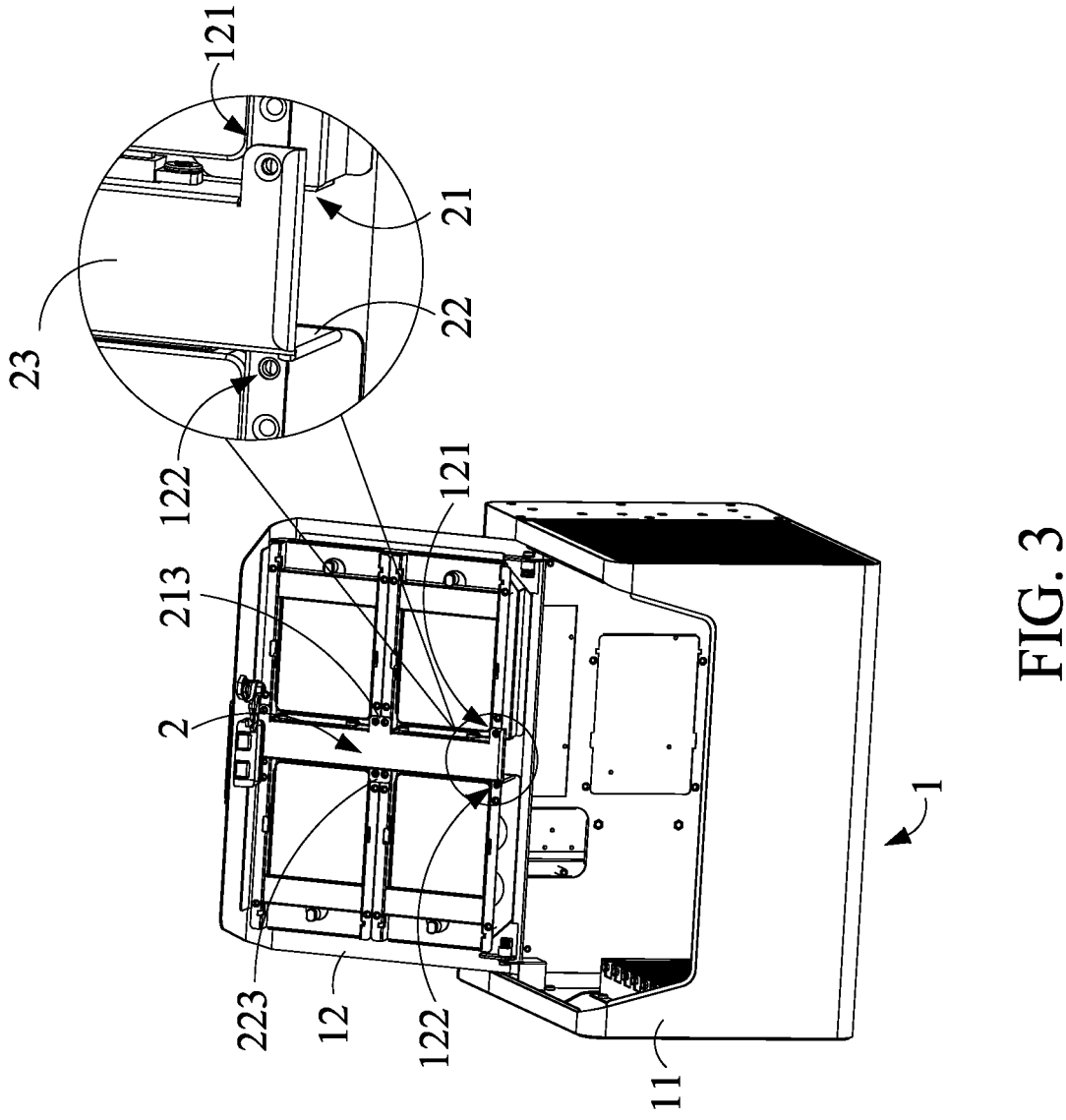
FIG. 3 is a perspective schematic diagram of a host casing having the detachable cable hub device according to an embodiment of the present disclosure.

As shown in FIG. 3, a host casing 100 having a detachable cable hub device according to an embodiment of the present disclosure includes a casing 1 and the detachable cable hub device 2.

The casing 1 includes at least two fixing frames 121 and 122, which are not located on a same plane. As shown by the enlarged part in FIG. 3, a position of the fixing frame 121 is slightly higher than a position of the fixing frame 122.

In an embodiment, the casing 1 includes a body 11 and an upper cover 12. The upper cover 12 is rotatably disposed at the body 11, and the upper cover 12 and the body 11 are clamped to form a space for storing a host. The at least two fixing frames 121 and 122 are disposed on a surface of the upper cover 12 facing the body 11. However, the present disclosure is not limited to the examples above. The at least two fixing frames 121 and 122 can be disposed on any parts of the casing 1.

Figure 1:
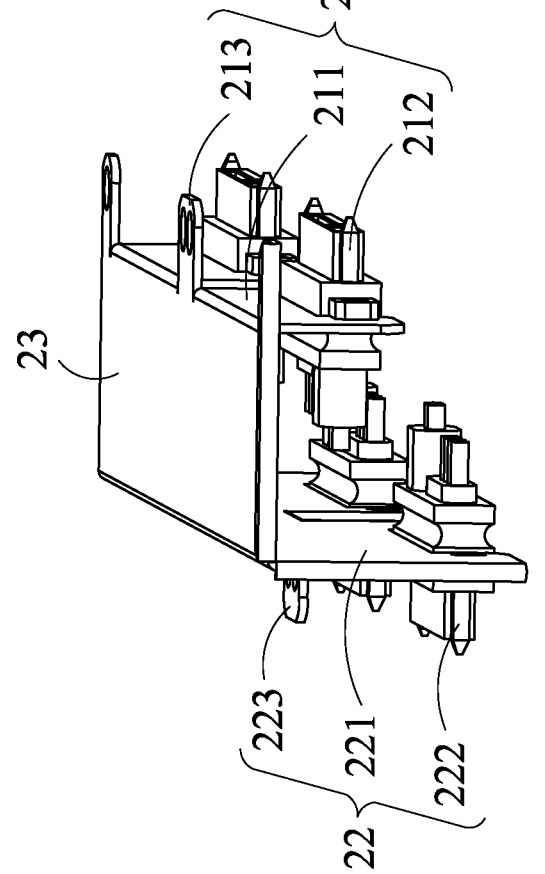
FIG. 1 is a perspective schematic diagram of a detachable cable hub device according to an embodiment of the present disclosure.
Figure 2:
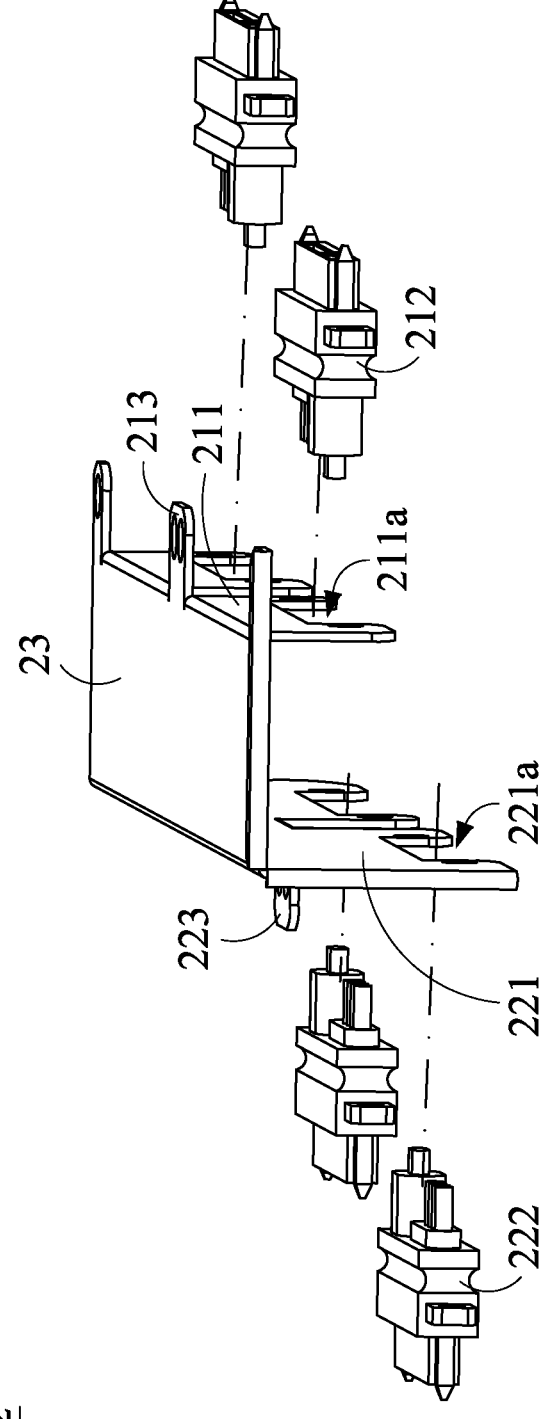
FIG. 2 is an assembly schematic diagram of the detachable cable hub device according to an embodiment of the present disclosure.

The detachable cable hub device 2 is disposed between the at least two fixing frames 121 and 122 described above. If there are more sets of fixing frames, these fixing frames are disposed in parallel on two sides of the detachable cable hub device 2. The detachable cable hub device 2 is used to gather signal cables of a plurality of data storage devices disposed at the at least two fixing frames 121 and 122. As shown in FIG. 1 and FIG. 2, the detachable cable hub device 2 of an embodiment includes a covering 23, a first connection module 21, and a second connection module 22.

The first connection module 21 includes a first sidewall 211 and at least one first connection seat 212, and one end of the first sidewall 211 is connected to a first side of the covering 23.

The second connection module 22 includes a second sidewall 221 and at least one second connection seat 222, and one end of the second sidewall 221 is connected to a second side of the covering 23, wherein the first side and the second side are two opposite sides. The first sidewall 211 and the second sidewall 221 are substantially parallel to each other, and preferably individually perpendicular to the covering 23. That is, the first sidewall 211, the second sidewall 221, and the covering 23 appear as an inverted U shape, however, the present disclosure is not limited to the example above.

The first sidewall 211 is provided with at least one first installation portion 211a, the second sidewall 221 is provided with at least one second installation portion 221a, and a distance of the first installation portion 211a from the covering 23 is different from a distance of the second installation portion 221a from the covering 23. That is, the first installation portion 211a and the second installation portion 221a are not on a same plane. The first installation portion 211a and the second installation portion 221a are in hollow forms, the at least one first connection seat 212 is disposed at the at least one first installation portion 211a, and the at least one second connection seat 222 is disposed at the at least one second installation portion 221a. The first connection seat 212 can be matchingly docked with the data storage device, and the signal cables extending from the first connection seat 212 are gathered in a space formed by the first sidewall 211, the second sidewall 221, and the covering 23. Similarly, the second connection seat 222 can be matchingly docked with the data storage device, and the signal cables extending from the second connection seat 222 are gathered in the space formed by the first sidewall 211, the second sidewall 221, and the covering 23. If there are multiple sets of the first connection seat 212 and the second connection seat 222, the first sidewall 211 and the second sidewall 221 can be respectively provided with a plurality of first installation portions 211a and a plurality of second installation portions 221a in corresponding quantities.

Installation directions of the first connection seat 212 and the second connection seat 222 on the detachable cable hub device 2 are opposite, such that the signal cables can be gathered inside the detachable cable hub device 2, that is, in the space formed by the first sidewall 211, the second sidewall 221, and the covering 23, thereby preventing the cables from being exposed and protecting the cables, as well as enhancing aesthetics and values of products.

In addition, when the detachable cable hub device 2 is installed between the two fixing frames 121 and 122, the distance of the first installation portion 211a to the covering 23 and the distance of the second installation portion 221a to the covering 23 exactly make up for a height difference between the two fixing frames 121 and 122. Since the first connection seat 212 and the second connection seat 222 installed on the first sidewall 211 and the second sidewall 221 are on different horizontal planes (that is, a staggered design), the distance between the first sidewall 211 and the second sidewall 221 is reduced to further reduce the overall configuration space of the casing 1, hence better meeting design requirements for miniaturization.

Further, in an embodiment, the covering 23, the first sidewall 211, and the second sidewall 221 are formed by bending one single sheet of material. The single sheet of material is, for example, sheet metal (an alloy or metal material), or a non-metallic material such as plastic or carbon fiber sheets. In an embodiment, the detachable cable hub device 2 can be an integral structure, however, the present disclosure is not limited to such an example.

Further, in an embodiment, the first connection module 21 further includes a first fixing portion 213 disposed on the first side of the covering 23. The first fixing portion 213 has, for example, a lock hole, for a screw to pass through so as to lock the first side of the covering 23 at the casing 1. The first fixing portion 213 can also be other structures, for example, a structure that fittedly fastens the first side of the covering 23 at the casing 1 and is detachable.

In an embodiment, the covering 23, the first sidewall 211, and the first fixing portion 213 are formed from bending a single sheet of material. For example, the first sidewall 211 can be cut and is bent, such that the first fixing portion 213 has a predetermined angle relative to the first sidewall 211 so as to be readily fixed at the casing 1. However, the present disclosure is not limited to the examples above.

Further, in an embodiment, the second connection module 22 further includes a second fixing portion 223 disposed on the second side of the covering 23. The second fixing portion 223 has, for example, a lock hole, for a screw to pass through so as to lock the second side of the covering 23 at the casing 1. The second fixing portion 223 can also be other structures, for example, a structure that fittedly fastens the second side of the covering 23 at the casing 1 and is detachable.

In an embodiment, the covering 23, the second sidewall 221, and the second fixing portion 223 are formed from bending a single sheet of material. For example, the second sidewall 211 can be cut and bent, such that the second fixing portion 223 has a predetermined angle relative to the second sidewall 221 so as to be readily fixed at the casing 1. However, the present disclosure is not limited to the examples above.

The present invention is described by way of the embodiments above. A person skilled in the art should understand that these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. A host casing having a detachable cable hub device, comprising:

a casing, comprising a body, an upper cover, and at least two fixing frames, wherein the upper cover is rotatably disposed at the body, the at least two fixing frames are disposed on a surface of the upper cover facing the body, and the at least two fixing frames are not located on a same plane; and a detachable cable hub device, disposed between the at least two fixing frames, wherein the detachable cable hub device comprises:

a covering;

a first connection module, comprising a first sidewall and at least one first connection seat, wherein one end of the first sidewall is connected to a first side of the covering; and a second connection module, comprising a second sidewall and at least one second connection seat, wherein one end of the second sidewall is connected to a second side of the covering, and the first side and the second side are two opposite sides, and wherein the first sidewall is provided with at least one first installation portion, and the second sidewall is provided with at least one second installation portion; a distance of the first installation portion to the covering is different from a distance of the second installation portion to the covering; and the at least one first connection seat is disposed at the at least one first installation portion, and the at least one second connection seat is disposed at the at least one second installation portion.

* * * * *